United States Patent [19]

Hineno et al.

[11] Patent Number: 4,653,664

[45] Date of Patent: Mar. 31, 1987

[54] AUTOMATIC COMPONENT MOUNTING APPARATUS

[75] Inventors: Kazuhiro Hineno, Gunma; Atsushi Kura, Saitama, both of Japan

[73] Assignees: Sanyo Electric Co; Tokyo Sanyo Elec, both of Japan

[21] Appl. No.: 622,734

[22] Filed: Jun. 20, 1984

[30] Foreign Application Priority Data

Jul. 1, 1983 [JP] Japan ................................. 58-120570

[51] Int. Cl.$^4$ ............................................. B65H 5/28
[52] U.S. Cl. .......................................... 221/3; 221/6; 221/74; 29/759
[58] Field of Search ........................ 221/3, 6, 7, 14, 71, 221/74; 206/330; 29/740, 759, 809, 818; 156/297

[56] References Cited

U.S. PATENT DOCUMENTS 2,719,651 10/1955 Gabrielsen ............................. 221/14
3,047,347 7/1962 Groves ................................. 221/7 X
3,917,045 11/1975 Williams et al. .................. 221/71 X
4,239,576 12/1980 Taki et al. ............................ 156/297
4,393,579 7/1983 Van Hooreweder ............ 29/759 X
4,458,412 7/1984 Dean et al. ........................ 29/759 X

OTHER PUBLICATIONS

IBM Technical Disclosure Bulletin, vol. 12, No. 7, Dec. 1969, pp. 932–933, *Single-Belt Cash Storage and Dispensing Mechanism.*

*Primary Examiner*—F. J. Bartuska
*Attorney, Agent, or Firm*—Darby & Darby

[57] ABSTRACT

An automatic mounting apparatus mounts chip-type electronic components on a printed circuit board. A plurality of chip-type electronic components are held at nearly equal intervals in the longitudinal direction of a tape, and this tape is drawn out from a tape reel to a feedout unit accommodated in a reel cassette together with the tape reel. The chip-type components are picked up one by one in sequence from the tape at the position of the feedout unit by a vacuum chuck, being placed on a predetermined position on the printed circuit board by this vacuum chuck. In the vicinity of the end of the tape holding the chip-type electronic components, a residual quantity indicator capable of mechanical detection is formed. When this residual quantity indicator is detected, the controller drives an alarm device such as, for example, a buzzer or a light emitter to inform that the chip-type electronic components on the tape will soon run out. Accordingly, the operator can prepare another new reel cassette before the chip-type electronic components on the tape run out.

5 Claims, 18 Drawing Figures

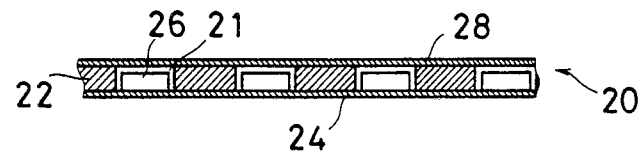
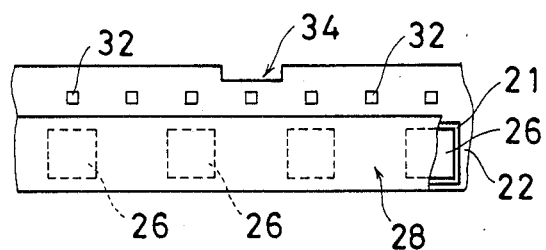
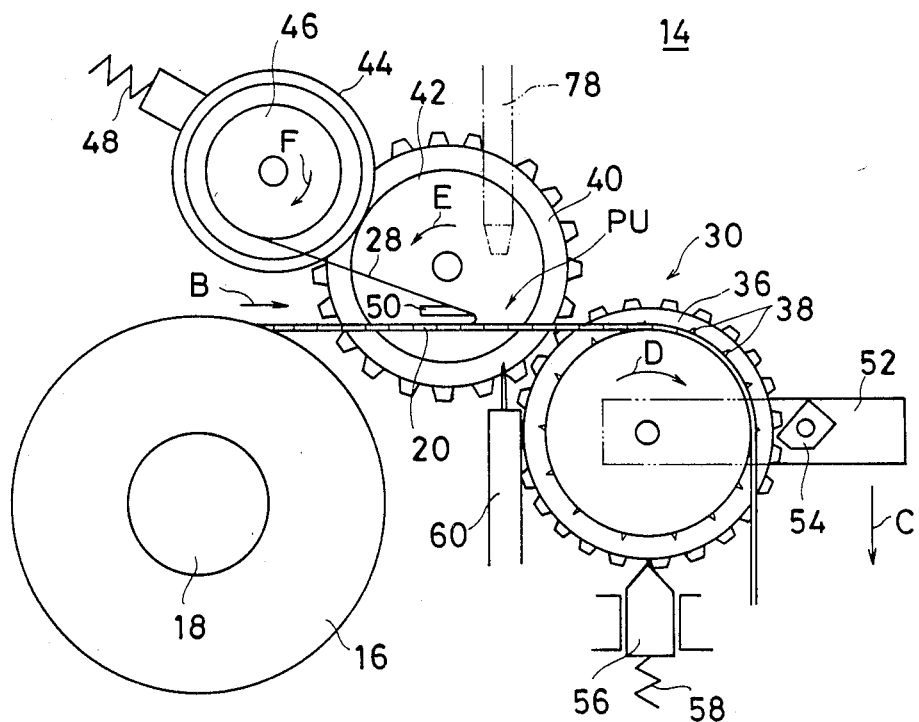

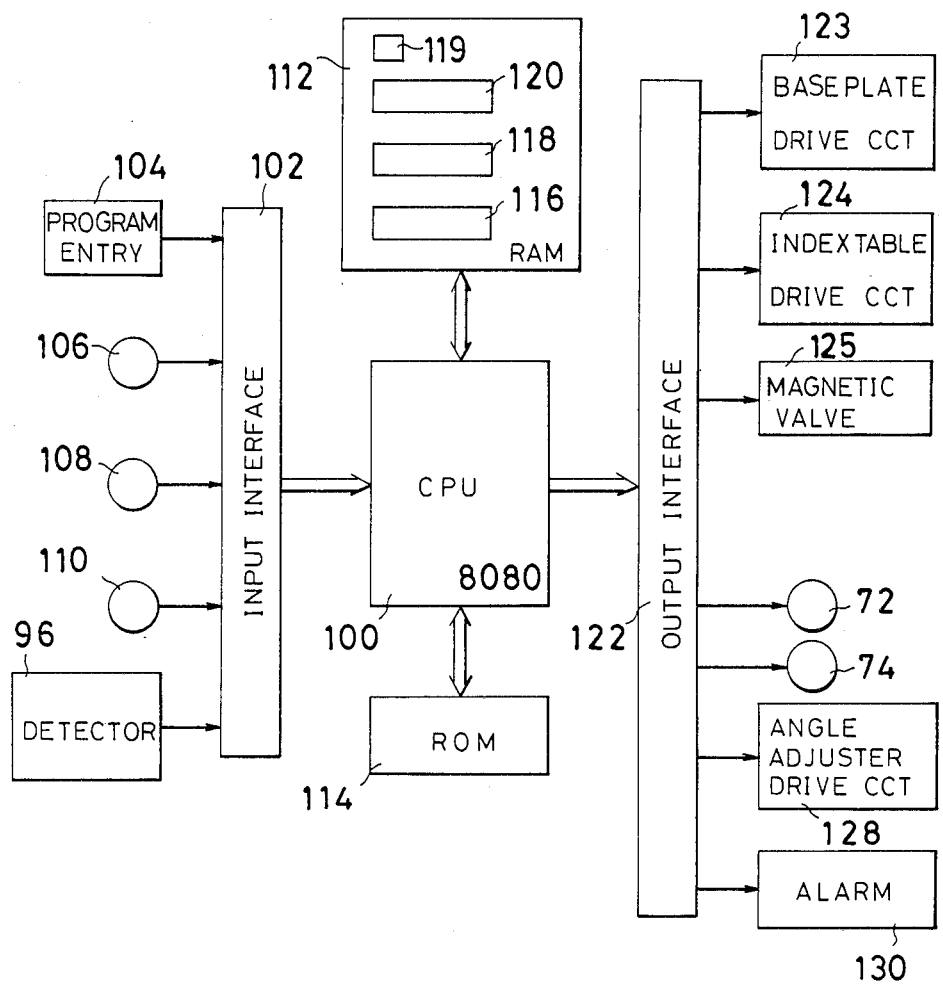

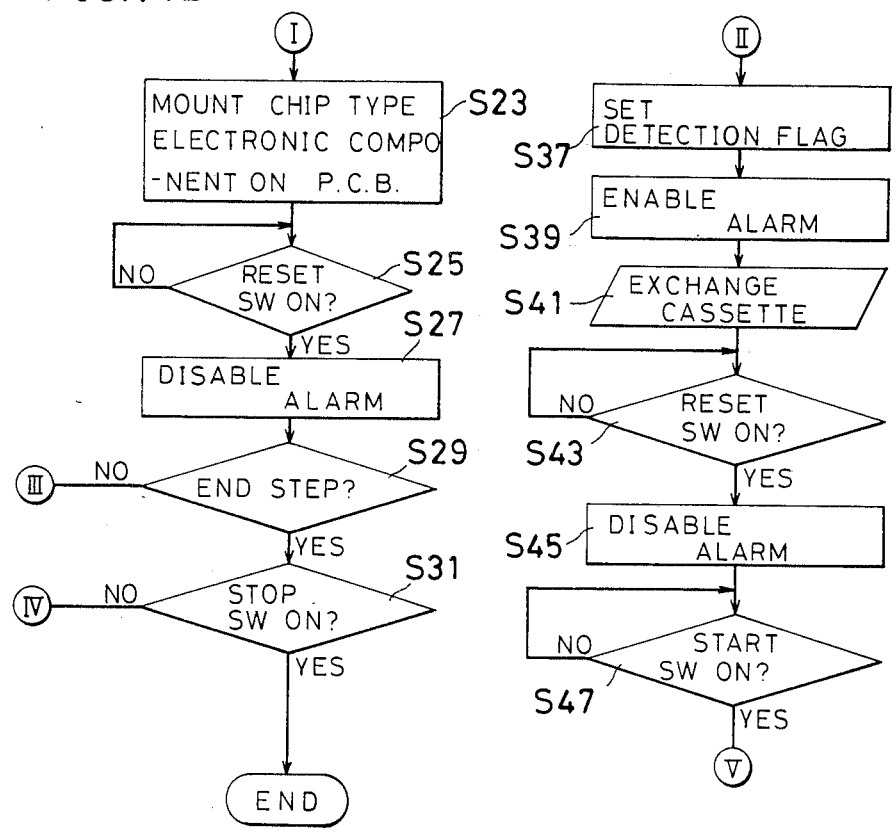

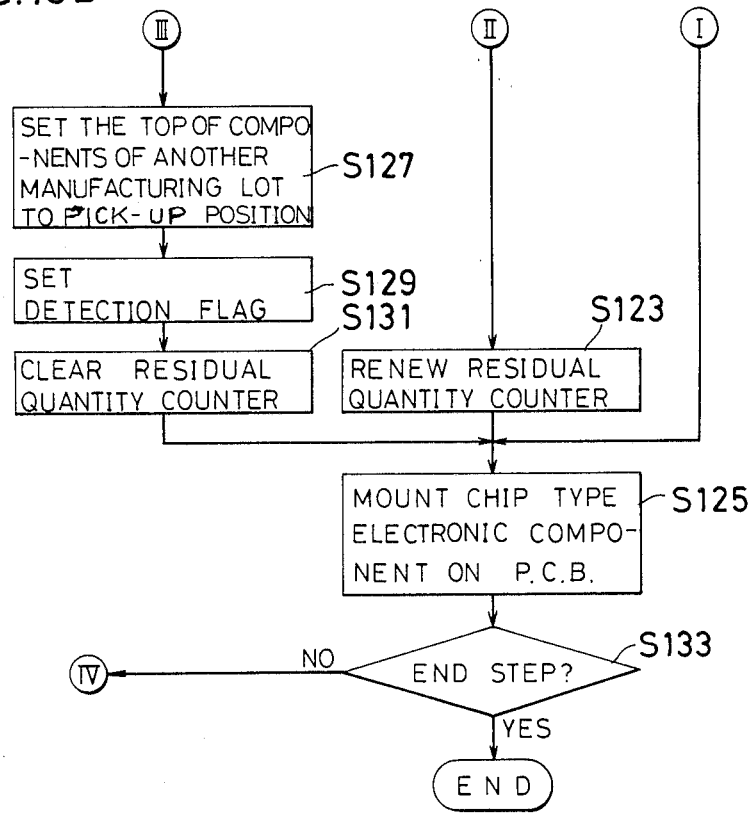

AUTOMATIC COMPONENT MOUNTING APPARATUS

BACKGROUND OF THE INVENTION

1. Field of the Invention

The present invention relates to an automatic mounting apparatus. More specifically, the present invention relates to an automatic mounting apparatus which picks up electronic components held on a tape one by one in sequence and mounts them on a printed circuit board.

2. Description of the Prior Art

Automatic mounting apparatuses for mounting electronic components such as, for example, capacitors, resistors, inductors, diodes and the like on the printed circuit board have been proposed and realized. One example of the conventional automatic mounting apparatus is disclosed in the U.S. Pat. No. 4,239,576 patented on Dec. 16, 1980, the U.S. Pat. No. 4,393,579 patented on July 19, 1983 and so on. Some kinds of the conventional automatic mounting apparatus hold electronic components on a tape at nearly equal intervals in the longitudinal direction thereof and pick up the electronic components from this tape one by one in sequence, mounting them on the printed circuit board. And then, when all the electronic components held on one tape have been picked up, the tape is replaced with new one, and the automatic mounting operation is continued. However, in the conventional automatic mounting apparatus, even when all the electronic components on the tape are picked up and the tape is emptied, no new tape can be prepared in advance because there is no means for detecting the empty state at all. On the other hand, operation of the automatic mounting apparatus is required to be stopped to replace the tape, and that no tape can be prepared in advance as is described above elongates the time for replacement, resulting in elongating the stop time of the automatic mounting apparatus. Consequently, in the conventional apparatuses, the rate of operation has been reduced due to the tape replacement.

SUMMARY OF THE INVENTION

Therefore, a principal objective of the present invention is to provide an automatic mounting apparatus capable of improving the rate of operation.

Electronic components are held on a tape-shaped member at nearly equal intervals in the longitudinal direction thereof. On one part in the longitudinal direction of the tape-shaped member, a residual quantity indicator capable of mechanical detection is formed. When this residual quantity indicator is detected, control means perform a predetermined process such as, for example, alarming or the like in response to the detection.

In accordance with the present invention, the operator can know, for example, by an alarm device that the electronic components will soon run out, and therefore a new holder of the electronic components can be prepared in advance. Accordingly, the stop time of the automatic mounting apparatus for replacing such an electronic component holder can be minimized. Accordingly, the rate of operation of the automatic mounting apparatus can be improved to a great extent. For example, it takes 0.4 second to mount one electronic component on the printed circuit board. On the other hand, operation of the automatic mounting apparatus has to be stopped at least for 5 to 10 minutes to replace the electronic component holder with new one without any previous preparation. That is to say, in the conventional apparatuses wherein no previous notice is made at all that the electronic components run out, the time during which as many as 750–1500 pieces of electronic components can be mounted is to be wasted to replace the electronic component holder. On the other hand, in accordance with the present invention, when the residual quantity of the electronic components on the electronic component holder can be informed to the operator in advance, such a loss time can be shortened to a great extent of about 30 seconds. An effect of shortening such a time for replacement is remarkable in the configuration wherein the tape reel and the feedout unit are built into one reel cassette.

In another embodiment in accordance with the present invention, in a case where a plurality of electronic components such as, for example, diodes, transistors or the like which are equal in characteristics are required to be mounted on the printed circuit board, by utilizing the residual quantity indicator, electronic components with different characteristics can be adequately prevented from being mounted on one printed circuit board. That is, the residual quantity indicator is formed at the position where an indication can be made that the residual quantity of the electronic components becomes a predetermined number. Then, in a case where n pieces of electronic components with equal characteristics are mounted on one printed circuit board, comparison of m pieces of residual quantity of electronic components with n pieces required is started in response to the detection of the residual quantity indicator. Then, m pieces of residual quantity are renewed every time the electronic components are mounted on the printed circuit board, and when m becomes smaller than n, (m<n), for example, the holder is transferred without unloading so as not to use the electronic components remaining on the holder. Consequently, electronic components differing in characteristics, that is, in manufacture lot can be effectively prevented from being mounted on one printed circuit board in a mixed fashion.

Detailed description on the present invention which is made hereinafter in reference to the attached drawings will further clarify the above-described objective and other objectives, aspects, features and advantages of the present invention.

BRIEF DESCRIPTION OF THE DRAWINGS

FIG. 2 is a cross-sectional view of a tape holding chip-type electronic components.

FIG. 3 is a plan view of a major part of a tape showing one example of a residual quantity indicator.

FIG. 4 is a view of mechanism showing one example of a reel cassette.

FIG. 8A, FIG. 8B through FIG. 11 are schematic views showing respectively different examples of the residual quantity indicator and the detective mechanisms thereof.

FIG. 12 is a block diagram showing an electric circuit of the embodiment in FIG. 1.

FIG. 13 is a schematic view showing one example of code format of program.

FIG. 14A and FIG. 14B are flow charts showing one example of manipulation or operation of the embodiment as shown in FIG. 1 and FIG. 12.

FIG. 15A and FIG. 15B are flow charts showing other examples of manipulation or operation of the embodiment as shown in FIG. 1 and FIG. 12.

DETAILED DESCRIPTION OF THE PREFERRED EMBODIMENTS

Figure 1:
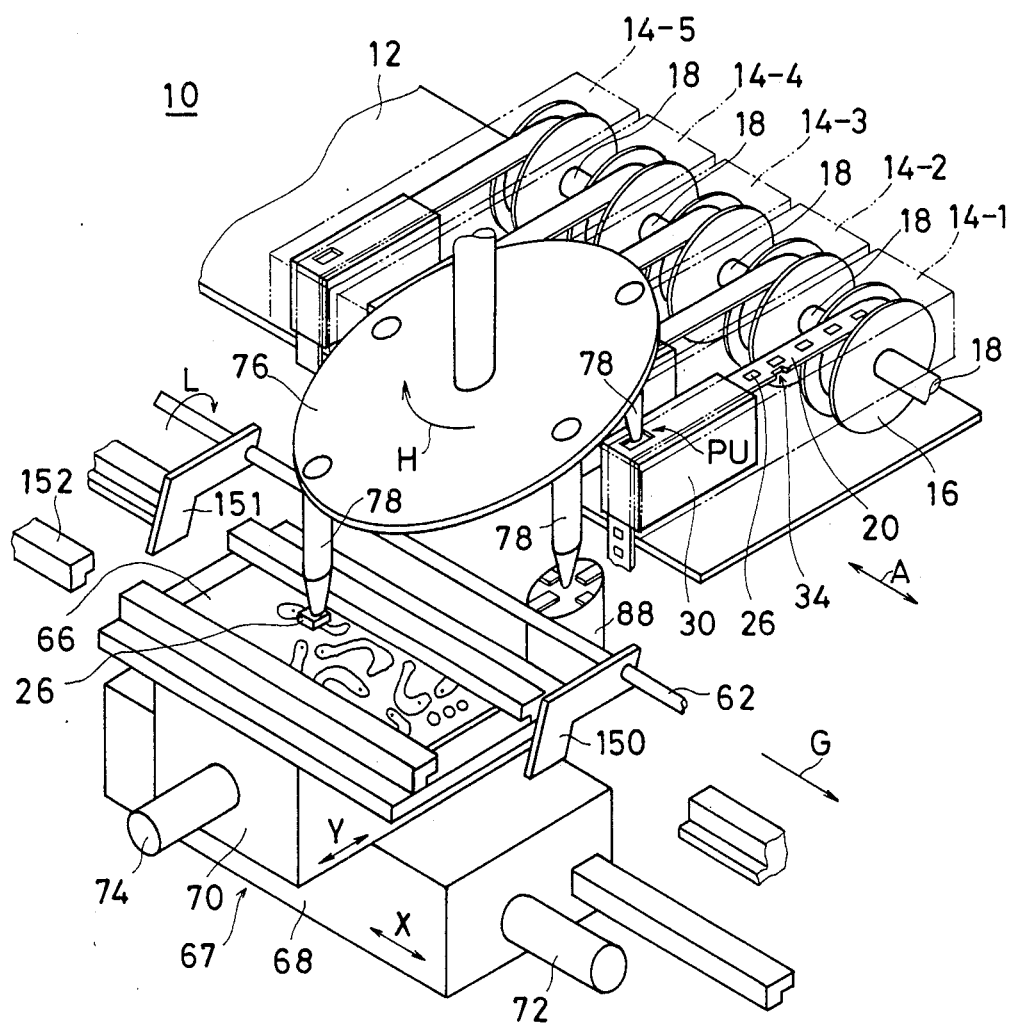
FIG. 1 is a perspective view showing a major part of one embodiment in accordance with the present invention.

FIG. 1 is a perspective view showing a major part of one embodiment in accordance with the present invention. This embodiment is an automatic mounting apparatus for mounting leadless electronic components, that is, chip-type electronic components on a printed circuit board. However, indication is made in advance that the present invention is applicable also to such apparatus automatically mounting electronic components with leads on the printed circuit board.

An automatic mounting apparatus 10 contains a base plate 12, and this base plate 12 is supported in a manner capable of moving in the direction shown by an arrow mark A by a base plate drive circuit 123 (FIG. 12). On the base plate 12, a plurality of (five in this embodiment) reel cassettes 14-1, 14-2, 14-3, 14-4 and 14-5 are placed and fixed nearly parallel to each other. A tape 20 holding the same kind or different kinds of chip-type electronic components 26 are accommodated in cassettes 14-1 through 14-5, respectively. And then, these electronic components are picked up one by one at a predetermined pick-up position PU formed in a fixed fashion. The reason why the base plate 12 is made movable in the direction shown by the arrow mark A is to bring a desired reel cassette to the fixed pick-up position PU. Then, selection of one cassette from among such tape reel cassettes 14-1 to 14-5 is accomplished by moving the base plate 12 in the direction shown by the arrow mark A as required in every program step.

A reel cassette 14 contains a tape reel 16, and a shaft 18 is inserted in the tape reel 16. Accordingly, the respective tape reel 16 is held by the respective shaft 18 being provided in association with the respective reel in a freely rotatable manner. The electronic component holder, namely, the tape 20 is wound around the tape reel 16, and a plurality of chip-type electronic components 26 are retained on the tape 20 at constant intervals. To be further detailed, as shown in FIG. 2, the tape 20 contains a base tape 22 wherein holes 21 for accommodating the chip-type electronic component 26 are formed and cover tapes 24 and 28 affixed to both main surfaces of this base tape 22. Then, one chip-type electronic component 26 is accommodated in each hole 21, being sealed in this hole 21 by means of cover tapes 24 and 28. Such tape 20 is drawn out from the tape reel 16, being brought to a feedout unit 30. Then, feed holes 32 for drawing out the tape 20 from the tape reel 16 with a constant pitch are formed on the tape 20 as shown in FIG. 3. Furthermore, as shown in FIG. 3 a notch 34 is formed at the side end in the vicinity of the end of the tape 20. This notch 34 functions as a residual quantity indicator, representing that only a small amount of chip-type electronic components remain after that position. Detection of this residual quantity indicator 34 is described later in reference to FIG. 6 and FIG. 7.

Here, a somewhat detailed description is made on the configuration of a reel cassette 14 in reference to FIG. 4. As is previously described, the tape reel 16 and the feedout unit 30 are accommodated in the reel cassette 14 while connected integrally, for instance, by means of a connecting plate (not illustrated). The feedout unit 30 contains a gear 36 having a plurality of pins 38 capable of engaging in the tape feed holes 32 (FIG. 3). Accordingly, by rotating the gear 36, the tape 20 can be drawn out in the direction shown by an arrow mark B. A gear 40 is installed so as to engage with this gear 36, and this gear 40 is fixed to a friction drum 42. The periphery of a friction rotary plate 44 fixed to a cover tape take-up 46 is brought in press-contact with the peripheral surface of the friction drum 42 by means of a spring 48. The cover tape take-up reel 46 takes up the cover tape 28 which is peeled off by a cover tape peeling plate 50 installed before the pick-up position PU.

A feed lever 52 for rotating the gear 36 with a constant pitch is further installed in the feedout unit 30. A claw 54 engaging with the gear 36 is fixed to this feed lever 52. Then, when the feed lever 52 is depressed in the direction shown by an arrow mark C, the gear 36 is rotated in the direction shown by an arrow mark D by an action of the claw 54, and the tape 20 is fed with a constant pitch in the direction shown by the arrow mark B by means of the pin 38. Furthermore, under the gear 36, a positioning member 56 for fixing the position of the gear 36 by utilizing an elastic force of a spring 58 is installed. A vacuum chuck 78 (FIG. 4) is brought to the pick-up position PU by an index table 76 (FIG. 1) as shown by a dash colon line. Detailed description is made later on this vacuum chuck 78. A push-up pin 60 for pushing up the chip-type electronic components from the rear side of the tape 20 in response to a descending operation of the vacuum chuck 78 is installed at the pick-up position PU.

In the tape reel cassette 14 of such a configuration, the tape 20 drawn out from the tape reel 16 is fed by just one pitch by a rotation of the gear 36 in the direction shown by the arrow mark D when the feed lever 52 is depressed in the direction shown by the arrow mark C, because the feed holes 32 (FIG. 3) are engaged with the pins 38 of the gear 36. At the same time, the gear 40, that is, the friction drum 42 is rotated in the direction shown by an arrow mark E. Accordingly, the friction rotary plate 44 in press-contact with the friction drum 42, that is, the cover tape take-up reel 46 is rotated in the direction shown by an arrow mark F. Accordingly, the cover tape 28 peeled off by the cover tape peeling plate 50 is taken up on the take-up reel 46. Then, the chip-type electronic component 26 is sucked up by the vacuum chuck 78 while being pushed up by the push-up pin 60, being picked up from the tape 20. Thus, by accommodating the tape reel 16 and the feedout unit 30 integrally in one cassette, the replacing operation of the tape can be made very simply.

Furthermore, in the normal automatic mounting operation, the feeding lever 52 is depressed in the direction shown by the arrow mark C in response to the rotation of the index table 76 as described later (FIG. 1). Accordingly, in the present embodiment, no driving source for drawing out or feeding the tape 20 is provided in the reel cassette 14, and the tape 20 is drawn out with a constant pitch by the lever 52 which is driven by a cam fixed on the rotary shaft of the index table 76. However, needless to say, for example, the gear 36 may be made drivable by a unique driving source such as, for example, a pulse motor or the like rather than by the driving of the index table 76.

Reverting to FIG. 1, a feeding rod 62 is installed parallel to the direction of movement of the base plate 12. This feeding rod 62 moves the feeding claws 150 and 151 for moving a printed circuit board 66 in the direction shown by an arrow mark G. That is to say, the printed circuit board 66 fed by a conveyor 152 is pushed by the feeding claw 151 and thereby carried on an XY table 67, and also the printed circuit board 66 placed on the XY table 67 is pushed by the feeding claw 150, thereby being carried out therefrom. Thereafter, the feeding rod 62 is rotated in the direction shown by an arrow mark L, and thereby the feeding claws 150 and 151 are lifted, being returned to the home positions thereof in the direction reverse to the direction shown by the arrow mark G. Drive of this feeding rod 62, that is, transport of the printed circuit 66 is accomplished by an air cylinder (not illustrated) controlled by a magnetic valve 125 (FIG. 12).

The XY table 67 comprises two tables 68 and 70, and the lower table 68 is displaced with a ball screw (not illustrated) in the direction of X-axis, that is, as shown by the arrow mark G by means of a motor 72. And then, on this table 68, the table 70 is displaced with a ball screw (not illustrated) in the direction Y-axis by means of a motor 74. Accordingly, by moving the XY table 67 by driving two motors 72, and 74, the printed circuit board 66 can be positioned at a predetermined position on the XY plane.

The index table 76 is installed in upper space between the base plate 12 and the XY table 67, and a plurality of (four in this embodiment) vacuum chucks 78 are installed in association with this index table 76. This index table 76 is driven to rotate in the direction shown by an arrow mark H by an index table drive circuit 124 (FIG. 12). That is to say, although not illustrated in the index table drive circuit 124, a motor with reduction gear is contained, and the index table 76 is rotated by 90 degrees every one rotation of the output shaft of this motor (360/the number of the vacuum chucks (4)). Then, in response to the rotation of the index table 76 in the direction shown by the arrow mark H, each vacuum chuck 78 is intermittently positioned in sequence from the electronic component pick-up position PU to an angle adjuster 88 and then from there to the position above the printed circuit board 66. Accordingly, the feeding lever 52 (FIG. 4) is depressed in the direction shown by the arrow mark C every ¼ rotation of the index table 76. Consequently, the chip-type electronic component is brought to the pick-up position PU every ¼ rotation of the index table 76. Furthermore, the negative pressure of the vacuum chuck 78 is controlled by a mechanical valve (not illustrated) being driven by the rotary shaft of the index table. That is to say, when the mechanical valve is turned on at a required timing, an appropriate negative pressure source is connected to the vacuum chuck 78, and a sucking force for sucking the chip-type electronic component is produced in the vacuum chuck 78. The angle adjuster 88 is intended to adjust the angle of the chip-type electronic component held by the vacuum chuck 78 with respect to the above mentioned X-Y axes (FIG. 1), being rotated by an angle adjuster drive circuit 128 (FIG. 12).

Figure 5:
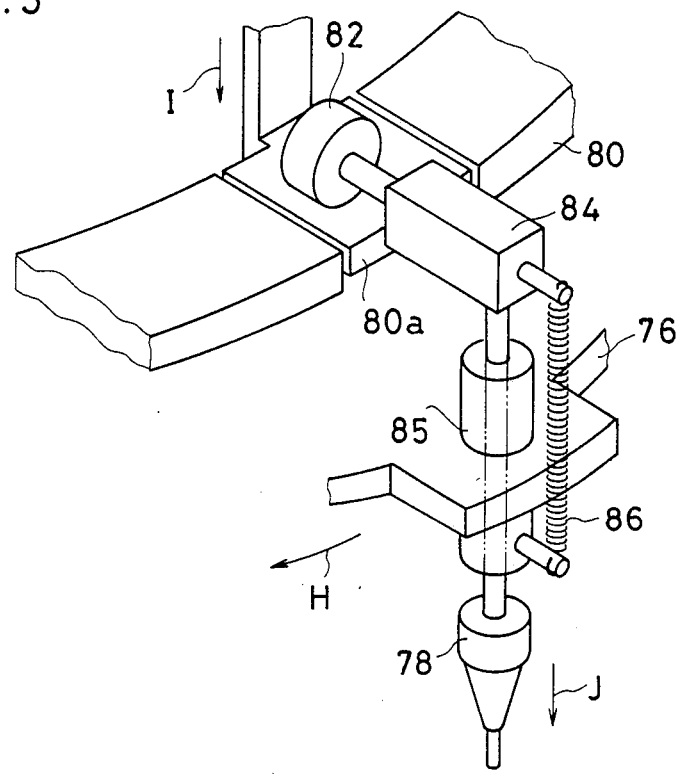
FIG. 5 is a perspective view of a major part for explaining motion of a vacuum chuck.

Here, description is made on the operation of the vacuum chuck 78 in reference to FIG. 5. As shown in FIG. 5, a guide 80 is installed in a fixed fashion above the index table 70 along the periphery thereof. This guide 80 includes an ascent/descent piece 80a which is separated from other parts at the positions where the vacuum chuck 78 is required to descend, that is, the pick-up position PU in FIG. 1, the position of the angle adjuster 88 and the position of the XY table 67. This ascent/descent piece 80a can descend in the direction shown by a arrow mark I by a cam (not illustrated). A roller 82 capable of rolling on the upper surface of the guide 80 is connected to a mounting part 84, and one end of the vacuum chuck 78 is fixed through a bearing 85 fixed to the index table 76 being inserted. And then, the mounting part 84 is normally drawn downwards by a spring 86 whose one end is fixed to the index table 76.

In the configuration as described above, the vacuum chuck 78 is rotated in the direction shown by the arrow mark H in response to the rotation of the index table 76. Furthermore, the roller 82 rolls on the guide 80 in response to the rotation of the index table 76. Then, the ascent/descent piece 80a descends by means of a cam (not illustrated) at the position where the vacuum chuck 78 is required to descend. Accordingly, the roller 82 descends by means of the ascent/descent piece 80a and the mounting part 84 descends by means of the spring 86, and in response to this, the vacuum chuck 78 inserted into the bearing 85 descends. Then, the cam (not illustrated) causes the ascent/descent piece 80a to ascend, the roller 82 is brought to the level of the guide 80 located on a fixed position, and the vacuum chuck 78 is returned again to the home position thereof.

Ascending/descending operation of the vacuum chuck 78 is performed as described above. Since such as ascending/descending operation of the vacuum chuck 78 is not so important for the present invitation, further detailed description is omitted here.

Furthermore, in the present embodiment, the chip-type electronic component is picked up and mounted on the printed circuit board by means of the index table. However, needless to say, the chip-type electronic component may be picked up and mounted on the printed circuit board, for example, by the configuration as disclosed in the U.S. Pat. Nos. 4,239,576 and 4,393,579 and the like which are cited previously other than such a configuration employing the index table.

Figure 6:
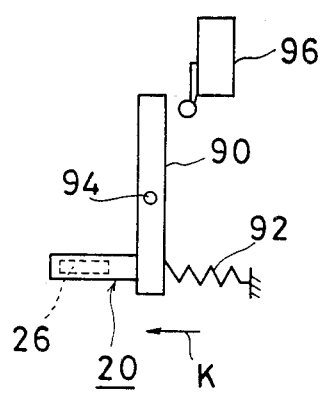
FIG. 6 and FIG. 7 are schematic views showing one example of detective mechanism of a residual quantity indicator.
Figure 7:
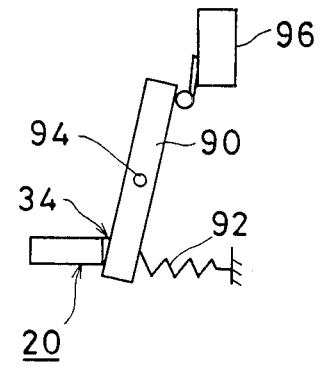

Next, description is made on a mechanism for detecting the residual quantity indicator being one of features of the present embodiment in reference to FIG. 6 and FIG. 7. In FIG. 6 and FIG. 7, an example is shown wherein the notch 34 as shown in FIG. 3 is formed as a residual quantity indicator. An a detecting lever 90 is installed outside the reel cassette 14-1 through 14-5 (FIG. 1) and on the feeding path of the tape 20. In further detail, the detecting lever 90 is supported by an axis 94 rotatable in the detection shown by an arrow mark K at a predetermined position of the automatic mounting apparatus 10 (FIG. 1), and the tip of the detecting lever 90 is touched with the side end of the tape 20 by means of a spring 92. On the other hand, a microswitch 96 is mounted so that the actuator thereof is positioned in the vincinity of the other end of the detecting lever 90. Meanwhile, the lever 90 and the microswitch 96 which constitute a detective mechanism may be installed inside the respective reel casettes 14-1 through 14-5 (FIG. 1). And when one end of the detecting lever 90 falls into residual quantity indicator, namely, the notch 34, the detecting lever 90 is rotated in the direction shown by the arrow mark K with the axis 94 centered by means of an elastic force of the spring 92. Accordingly, the other end of this detecting lever 90 contacts with the actuator of the microswitch 96 and this microswitch 96 is turned on or off. Thus, a signal indicating a detection of the notch, namely, the residual quantity indicator 34 can be outputted from this microswitch 96. Different residual quantity indicators and detecting mechanisms thereof as shown in FIG. 8A, FIG. 8B through FIG. 11 may be employed.

Figure 8A:
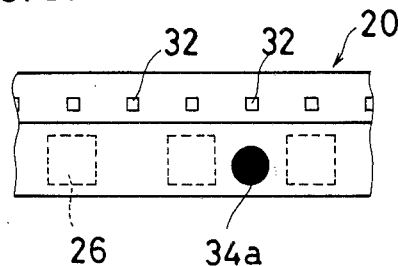
Figure 8B:
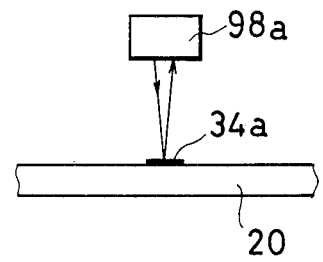

FIG. 8A is a schematic plan view showing another example of the residual quantity indicator, and FIG. 8B is a side view thereof. For example, a seal 34a of a light absorbing material or of a material causing diffused reflection is affixed to a predetermined position on the cover tape 28 of the tape 20. And, a reflection-type photoelectric switch 98a is mounted above the feeding path of the tape 20. In the normal state, a light from the photoelectric switch 98a is reflected by the cover table 28, and is returned again to the photoelectric switch 98a. However, at the position of the seal 34a, the light is absorbed or reflected diffusively, being not returned to the photoelectric switch 98a. Accordingly, the seal 34a as a residual quantity indicator can be detected by this photoelectric switch 98a. Furthermore, the position where this seal 34a is to be affixed may be the side end of the tape 20.

Figure 9:
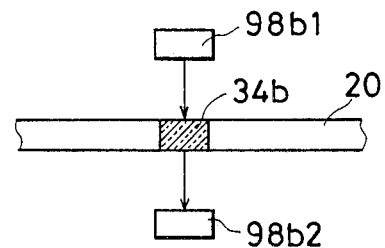

FIG. 9 is a schematic side view showing another example of the residual quantity indicator. On a part in the longitudinal direction of the tape 20, a through hole or transparent part 34b which can be distinguished from the feed hole 32 (FIG. 3) is formed. An then, a light emitter 98b1 and a light receiver 98b2 are disposed in an opposite fashion with the tape 20 placed in between. In the normal state, the light from the light emitter 98b1 is shaded by the tape 20 and does not reach the light receiver 98b2. When the transparent part 34b is located between the light emitter 98b1 and the light receiver 98b2 in the vicinity of the end of the tape, the light receiver 98b2 receives the light from the light emitter 98b1. Accordingly, the transparent part 34b, namely, the residual quantity indicator can be detected by the light receiver 98b2.

Figure 10:
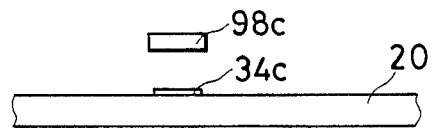

FIG. 10 is a schematic side view showing still another example of the residual quantity indicator. A film 34c of a magnetic material, for example, a ferromagnetic substance is afixed to a part in the longitudinal direction of the tape 20 as a residual quantity indicator. And then, for example, a magnetic detector 98c containing the Hall element is mounted above the feeding path of the tape 20. When the ferromagnetic film 34c is detected, a detection signal is obtained from the magnetic detector 98c. Furthermore, when the ferromagnetic film 34c is formed with a magnet material such as ferrite, the magnetic detector 98c may be such as a reed switch capable of being turned on or off by this film.

Figure 11:
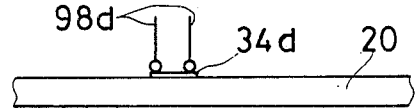

FIG. 11 is a schematic side view showing another example of the residual quantity indicator. In this example, a conductive film 34d is affixed to the tape 20 as a residual quantity indicator. Then, two contacts 98d are mounted which contact with the upper surface of the tape 20 and are separated from each other. Then, an appropriate voltage source is connected between these contacts 98d. In the normal state, the contacts 98c are kept opened because the surface of the tape 20 is of an insulating material. However, when the conductive film 34d comes to this position, two contacts 98d are put in a conductive state by this film 34d, and consequently a detection signal can be obtained from these contacts 98d.

Furthermore, for the residual quantity indicator and detecting mechanism thereof, the skilled in the art will easily understand that other arbitrary configuration such as a method of detecting the change in electrostatic capacity or the like can be utilized.

FIG. 12 is a block diagram showing an electric circuit of the embodiment in FIG. 1. In the present embodiment, for example, the Intel 8080 is employed for a CPU 100. Input means 104 for inputting programs and other data such as keyboard, tape reader, floppy disk drive unit and the like are connected to this CPU 100 through an input interface 102. A start switch 106, a stop switch 108 and a reset switch 110 are further connected and also the above mentioned means for detecting residual quantity indicator, for example, the microswitch 96 is connected to the input interface 102. The start switch 106 is a command switch for starting the automatic mounting operation, the stop switch 108 is a switch for stopping the automatic mounting operation, and the reset switch 110 is a switch for resetting an alarm device 130 described later. A RAM 112 and a ROM 114 are connected to the CPU 100, and an address counter 116 wherein programs inputted from the input means 104 are loaded in formed in the RAM 112, and also a part of this RAM 112 is used as a step counter 118, a residual quantity counter 120 and a detection flag 119. The ROM 114 is intended to store system programs or store user programs.

The CPU 100 provides control signals to the base plate drive circuit 123 and the like through an output interface 122. That is to say, the base plate drive circuit 123, the index table drive circuit 124, the magnetic valve 125, the motors 72 and 74, the angle adjuster drive circuit 128 and the alarm device 130 are connected to the CPU 100 through the output interface 122. For the alarm device 130, a device raising an audible alarm such as a buzzer and a device raising a visible alarm such as a flash light are used in a single or combined manner.

Next, one example of the program format is described in reference to FIG. 13. In the present embodiment, a program is prepared by the ASCII code. This program can be inputted into the CPU 100, that is, the RAM 112 from a punch tape, a magnetic disk, a magnetic drum or other memory means through the input means 104 (FIG. 12). Furthermore, the program may be inputted through an input means such as a keyboard capable of entering alphanumerics.

FIG. 13 shows one program step. That is, in the present embodiment, program step No. data 134, X-axis (FIG. 1) position data 136, Y-axis (FIG. 1) position data 138, angle data 140, reel No. data 142 and a control command 144 are contained. The angle data 140 are data for the angle to be adjusted by the angle adjuster 88, and the reel No. data are data indicating anyone from among the reel cassettes 14-1 through 14-5 (FIG. 1). Then, when "E" of the ASCII code is present in the control command 144, it represents that the program step is the end step. Also, if "1" is present in this control command 144, it shows that a plurality of electronic components such as diodes having similar characteristics (hereinafter referred to as "a set of electronic components") are to be mounted on one printed circuit board 66 (FIG. 1) in this step.

Figure 14A:
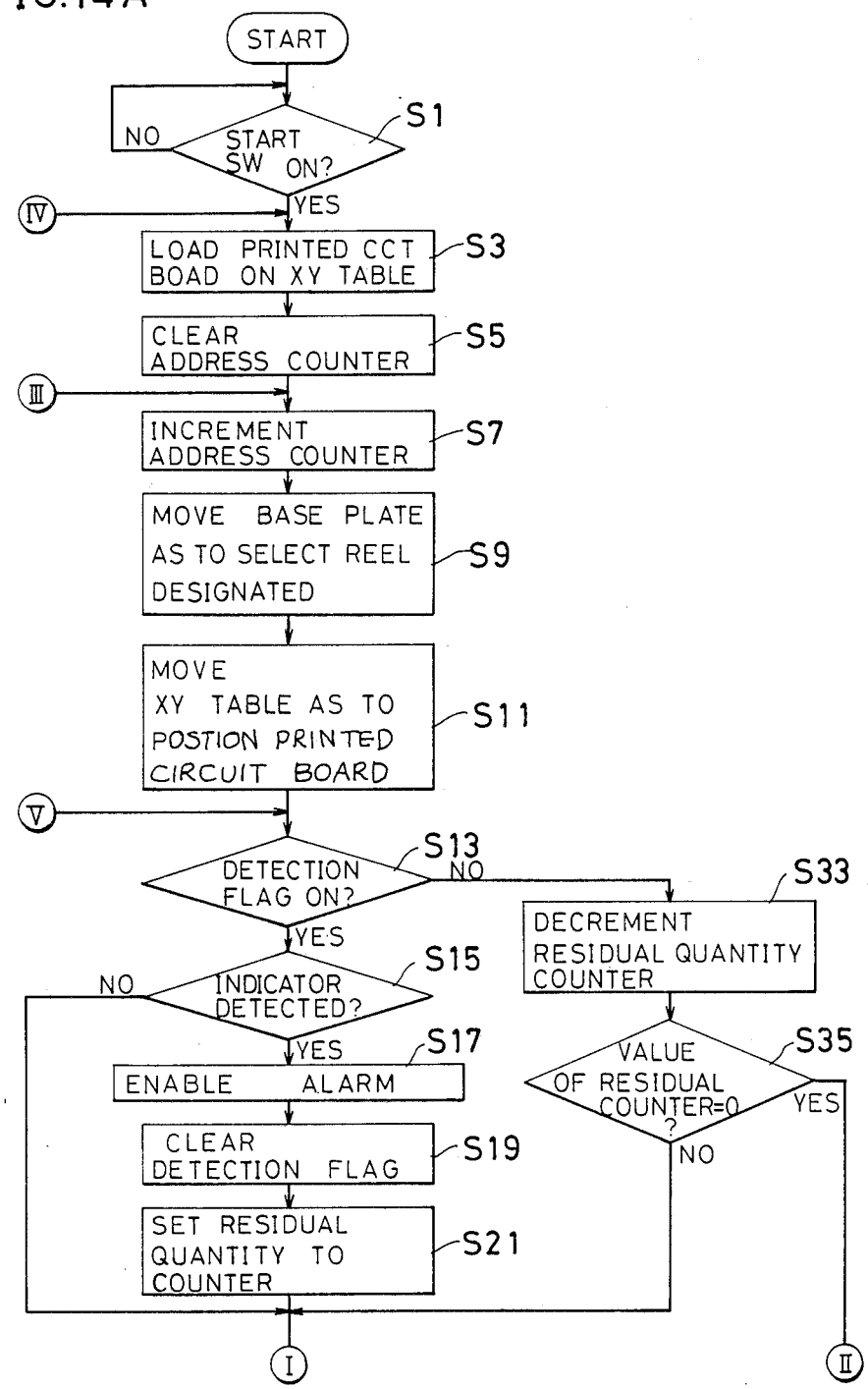

Next, description is made on manipulation or operation of the embodiment in reference to FIG. 14A and FIG. 14B. The power switch (not illustrated) is turned on, and then the start switch 106 is turned on, and thereby the automatic mounting operation is started.

Prior to this start, needless to say, a required reel cassette is attached and a required printed circuit board is mounted on a conveyor frame. Also, for example, the program is red through the tape reader 104, and in every program step a program code (FIG. 13) is loaded into the address counter 116 of the RAM 112 associated with the CPU 100.

After detecting that the start switch 106 has been turned on in step S1, the CPU 100 subsequently loads the printed circuit board 66 on the XY table 67 in step S3 as shown in FIG. 1. That is to say, in this step S3, the CPU 100 provides a signal to the magnetic valve 125 through the output interface 122, driving the air cylinder (not illustrated) and carrying the printed circuit board 66 on the XY table 67. In the following step s5, the CPU 100 clears the step counter 118 in the RAM 112. That is, in this step S5, the step counter 118 is initialized. In step S7, the CPU 100 increments the step counter 118 which has been cleared in the preceding step S5, and thereby the initial step of the program is addressed. Then, data of the program step in the address counter 116 addressed by the step counter 118 are read out by an appropriate register in the CPU 100 (not illustrated) to be loaded. In the following step S9, the CPU 100 sends a control signal to the base plate drive circuit 123 through the output interface 122 in response to the content of the program step read into that register, namely, the reel No. data 142 (FIG. 13), and positions the tape reel cassette of that number at the pick-up position PU (FIG. 1). Subsequently, in step S11, the CPU 100 positions the XY table 67 in response to the content of that program step, namely, the X-axis data 136 and the Y-axis data 138.

In the next step S13, the CPU 100 checks the detection flag 119 in the RAM 112 and decides whether it is turned on. That is, decision is made on if the residual quantity indicator 34 has ever been detected previously. Then, if the decision is "YES" in this step S13, the CPU 100 proceeds to the following step S15, and if the decision is "NO", it proceeds to step S33.

In step S15, the CPU 100 decides whether a detection signal of the residual quantity indicator from the microswitch, namely, the means for detecting residual quantity indicator 96 is present, that is, whether a sufficient amount of chip-type electronic components still remain in the reel cassette.

Then, if the decision is "YES" in this step S15, the CPU 100 proceeds to the succeeding step S17, and if the decision is "NO" in step S15, it proceeds to step S23.

In step S17, the CPU 100 provides a drive signal to the alarm device 130 through the output interface 122 and the alarm device 130 is actuated and audible and/or visible alarms are raised. Then, in step S19, the detection flag 119 is cleared. Thereafter, in step S21, the CPU 100 sets the residual quantity for the residual quantity counter 120. That is to say, since the residual quantity indicator 34 has been detected in the previous step S15, if this residual indicator 34 is formed at the position where the residual quantity becomes a constant number, the residual quantity can be grasped reliably at this point. Accordingly, in this step S21, the residual quantity, for example, 40 pieces, which can be grasped in such a manner has only to be set for the residual quantity counter 120. Thereafter the CPU 100 proceeds to step S23.

In step S23, the chip-type electronic component is sucked by the vacuum chuck 78, and is mounted on the printed circuit board 66 on the XY table 67. That is to say, the CPU 100 provides a control signal to the index table drive circuit 124 to turn the index table 76 (FIG. 1) by ¼ rotation, picking up the chip-type electronic component brought to the pick-up position PU by means of the vacuum chuck 78. Subsequently, the vacuum chuck holding the chip-type electronic component is brought to the angle adjuster 88 in response to the rotation of the index table 76. Then, the CPU 100 provides a control signal to the angle adjuster drive circuit 128 through the output interface 122 in response to the content of the program previously loaded in the register, namely, the angle data 140 (FIG. 13). In response to this, the chip-type electronic component sucked to the vacuum chuck 78 is adjusted to a desired angle. Subsequently, the CPU 100 positions the XY table 67, that is, the printed circuit board 66.

In the next step S25, the CPU 100 decides whether the reset switch 110 is turned on, and if the reset switch 110 is turned on, the CPU 100 stops the drive signal to the alarm device 130 in the following step S27.

In the following step S29, the CUP 100 checks whether "E" is present in the control command of the program step, and decides if the program step is the final step. If the program step is not the final step, the CPU 100 returns to the previous step S7, and if it is the final program step, the CPU 100 checks a predetermined flag in the RAM 112 (not illustrated) and thereby decides whether the stop switch 108 (FIG. 12) is turned on in the succeeding step S31. If the decision is "NO" in this step S31, the CPU 100 returns to the previous step S3, and if the decision is "YES", the operation in the automatic mounting mode ends.

If the detection flag 119 is not turned on in the previous step S13, the CPU 100 decrements or renews the residual counter 120 in step S33. And then, in the following step S35, the CPU 100 decides whether the content of the residual quantity counter 120, that is, the residual quantity of chip-type electronic components on the tape now in use has become zero. If the residual quantity is not zero, the CPU 100 proceeds to step S23, and if zero, it proceeds to step S37. In step S37, the detection flag 119 is set.

In step S39, the CPU 100 provides a signal to the alarm device 130 through the output interface 122. Accordingly, in step S39, the alarm device 130 is actuated and the audible and/or visible alarms are raised. The operator notices an alarm by the alarm device 130 and replaces the reel cassette whose residual quantity of chip-type electronic components has become small with a new one (step S41). The alarm device 130 continues to alert until the reset switch 110 (FIG. 12) is turned or in the following step S43, and the CPU 100 stops the signal to the alarm device 130 in step S45 where the reset switch 110 is turned on. And then, if the start switch 106 is turned on again in step S47, the CPU 100 returns to the previous step S15. Accordingly, if the cassette is not replaced with a new one despite detecting that the residual quantity has become small in step S15 the automatic mounting apparatus suspends the operation in the automatic mounting mode until the cassette is replaced.

Figure 15A:
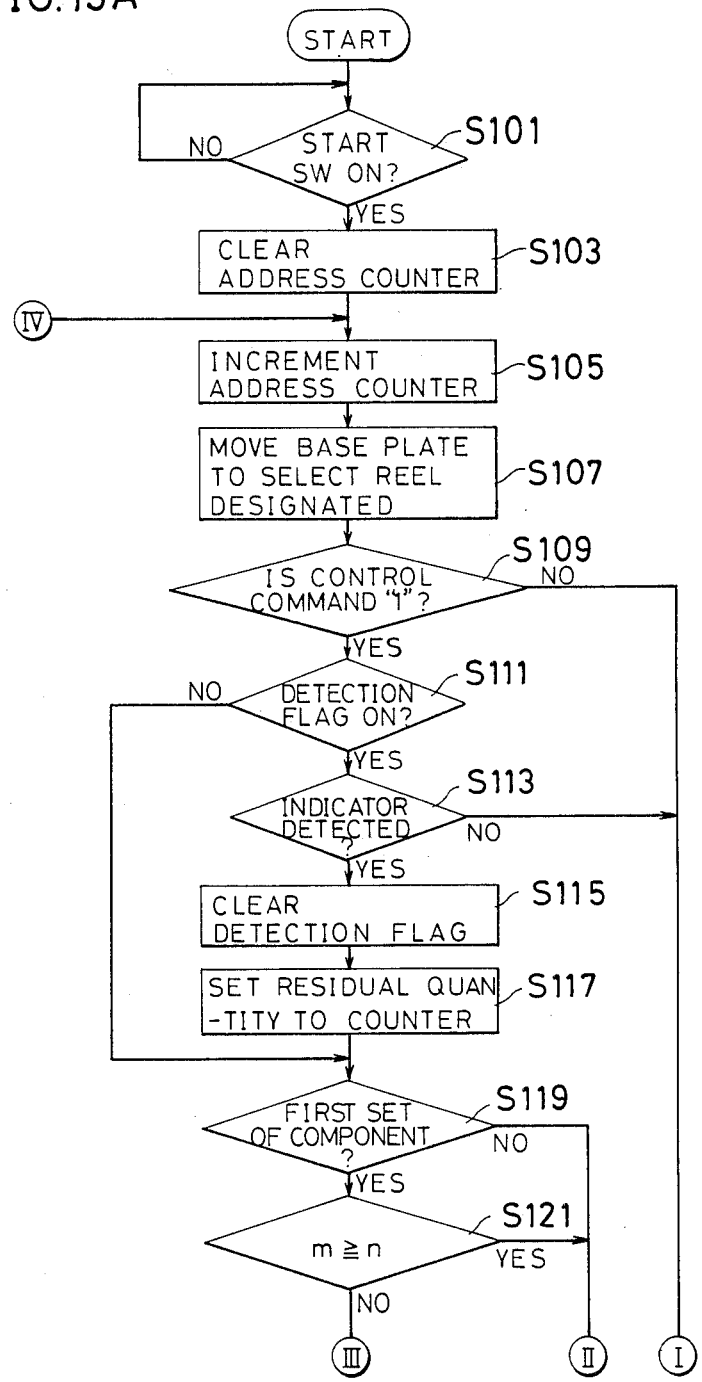

Next, description is made on another manipulation or operation in the automatic mounting mode in reference to FIG. 15A and FIG. 15B. A flow chart as shown in FIG. 15A and FIG. 15B is advantageously applied to a case where "a set of electronic components" are mounted on the printed circuit board. In the first step S101 as shown in FIG. 15A, the CPU 100 decides whether the start switch 106 is depressed, the CPU 100 clears the step counter 118 (FIG. 12) in the following step S103, and increments the step counter 118 in the following step S105. Accordingly, a program step is addressed in this step 106, and the base plate drive circuit 123 is controlled in response to the content of the program code of the program step (FIG. 13), namely, the reel No. data 142, and the reel of the number required for the program step is positioned so as to be placed at the pick-up position PU (FIG. 1) in the following step S107. In the following step S109, the CPU 100 decides whether "1" is present in the content of the program step read in an appropriate register, namely, the control command 144, that is, if the electronic components to be mounted in that program step are "a set of electronic components". If they are not "a set of electronic components", the same operation as shown in step S23 of the previous flow chart as shown in FIG. 14 is performed in step S125.

If the control command 144 is "1", the CPU 100 checks the detection flag 119 and decides whether the flag 119 has been set in the following step S111. In the following step S113, the CPU 100 decides whether the detecting means, for example, the microswitch 96 has detected the residual quantity indicator 34. If the decision is "YES" in this step S113, the CPU 100 clears the detection flag 119 in the RAM 112 in the following step S115. When the detection flag 119 is cleared, the residual number of chip-type electronic components can be clearly grasped, for example, as 40 pieces at this point. Because, the residual quantity indicator 34 (FIG. 3) is formed at the position where 40 pieces remain. Accordingly, in the following step S117, the CPU 100 sets the residual quantity, for example, 40 pieces for the residual quantity counter 120 in the RAM 112. Thereby, a particular control for a "set of electronic components" is started.

In step S119, the CPU 100 decides whether the program step is the first "set" after setting the residual quantity counter 120. If it is the first "set", the CPU 100 decides whether the residual quantity (m) is larger than the number (n) of "a set of electronic components" in the following step S121. This decision can be made by comparing the number (n) programmed in advance with the value (m) in the residual quantity counter 120 by the CPU 100.

When the decision in step S119 is "NO", or when the decision in step S121 is "YES", the CPU 100 moves to step S123. The CPU 100 decrements or renews the residual counter 125 in this step S123, and in the following step S125, like the previous step S23 in FIG. 4, the chip-type electronic components are sucked by the vacuum chuck 78 (FIG. 1), being mounted on the printed circuit board 66 on the XY table 67.

If m<n holds, that is, if the number (m) of chip-type electronic components remaining in the reel cassette is smaller than the number (n) required for one set, the tape 20 on the reel is fed without unloading so as not to use m pieces of remaining chip-type electronic components in the following step S127. Concretely, in step S127, the vacuum chuck 78 picks up the chip-type electronic components from the pick-up position PU as usual, but the picked-up electronic components are discarded without the treatments thereafter, that is, angle adjustment by the angle adjuster 88 and mounting on the printed circuit board 66. And then, the head of the chip-type electronic components of another manufacture lot is brought to the pick-up position PU by replacing the reel cassette or the like. Thereafter, the CPU 100 sets the detection flag 119 in step S129 and also clears the residual quantity counter 120 in step S131. Thereafter, the CPU 100 passes through the above mentioned step S125, and further checks the control command 144 of the program step in step S133. If "E" is present there, the CPU 100 decides that it is the final step, and terminates ends the operation in automatic mounting mode. If it is not the final program step, the CPU 100 returns to the previous step S105.

In the above mentioned embodiment, the position where the residual quantity indicator is formed has only to be set appropriately in response to the number required for one set of "a set of electronic components".

Although the present invention has been described and illustrated in detail, it is clearly understood that the same is by way of illustration and example only and is not to be taken by way of limitation the spirit and scope of the present invention being limited only by the terms of the appended claims.

What is claimed is:

1. An automatic component mounting apparatus for mounting sets of components onto printed circuit boards comprising:
    an electronic component holder including a tape-shaped member whereon a plurality of electronic components are arranged in the longitudinal direction thereof, and a residual quantity indicator formed at a predetermined position in the longitudinal direction of said tape-shaped member before the end of said tape-shaped member, a predetermined number of electronic components being arranged between said predetermined position and said end of said tape-shaped member,
    detecting means for detecting said residual quantity indicator, said detecting means being installed along a feeding path of said tape-shaped member,
    counter means for counting the number (m) of electronic components remaining on said tape-shaped member after the detection of said detecting means, and
    means for suspending mounting of the electronic components remaining on said tape-shaped member onto a printed circuit board when the counted value (m) by said counter means becomes smaller than a predetermined number (n) of electronic components required for one complete set of usage thereof.

2. An automatic component mounting apparatus in accordance with claim 1, further comprising means for raising an alarm in response to said detecting means detecting said residual quantity indicator, said alarm indicating that only a predetermined number of electronic components remain on said tape-shaped member.

3. An automatic component mounting apparatus for mounting sets of components onto printed circuit boards comprising:
    an electronic component holder including a tape-shaped member whereon a plurality of electronic components are arranged in a longitudinal direction, and a residual quantity indicator formed at a predetermined position in the longitudinal direction of said tape-shaped member before the end of said tape-shaped member, a predetermined number of electronic components being arranged between said predetermined position and said end of said tape-shaped member;

means for detecting said residual quantity indicator, said detecting means being installed along a feeding path of said tape-shaped member;

means for counting a number (m) of electronic components remaining on said tape-shaped member after the detection of said detecting means;

commanding means for setting a control command indicative that a set of electronic components are to be mounted on said printed circuit board;

determining means for determining whether said counted value (m) is smaller than a predetermined number (n) of electronic components corresponding to one set of electronic components, said determining means being responsive to said commanding means so that said apparatus operates in one fashion when a set of components is to be mounted, and another fashion when components to be mounted are not arranged in a set; and suspending means for suspending mounting of the electronic components remaining on said tape-shaped member onto the printed circuit board in response to determination by said determining means.

4. The automatic component mounting apparatus according to claim 3, wherein said suspending means includes means for feeding said tape-shaped member without loading remaining electronic components.

5. The automatic component mounting apparatus according to claim 3, further comprising means for raising an alarm in response to said determination by said determining means.

* * * * *